United States Patent
Park et al.

(10) Patent No.: US 11,114,559 B2
(45) Date of Patent: Sep. 7, 2021

(54) SEMICONDUCTOR DEVICE HAVING REDUCED GATE CHARGES AND SUPERIOR FIGURE OF MERIT

(75) Inventors: Chanho Park, Pleasanton, CA (US); Kyle Terrill, Santa Clara, CA (US)

(73) Assignee: Vishay-Siliconix, LLC, San Jose, CA (US)

( * ) Notice: Subject to any disclaimer, the term of this patent is extended or adjusted under 35 U.S.C. 154(b) by 3 days.

(21) Appl. No.: 13/475,255

(22) Filed: May 18, 2012

(65) Prior Publication Data

US 2012/0292696 A1 Nov. 22, 2012

Related U.S. Application Data

(60) Provisional application No. 61/487,627, filed on May 18, 2011.

(51) Int. Cl.
| | |
|---|---|
| *H01L 27/088* | (2006.01) |
| *H01L 29/78* | (2006.01) |
| *H01L 29/40* | (2006.01) |
| *H01L 29/66* | (2006.01) |
| H01L 29/417 | (2006.01) |
| H01L 29/423 | (2006.01) |

(52) U.S. Cl.
CPC ........ *H01L 29/7813* (2013.01); *H01L 29/407* (2013.01); *H01L 29/66727* (2013.01); *H01L 29/66734* (2013.01); H01L 29/41766 (2013.01); H01L 29/4238 (2013.01)

(58) Field of Classification Search
CPC .............. H01L 29/407; H01L 29/7813; H01L 29/66727; H01L 29/66734; H01L 29/41766; H01L 29/4238; H01L 27/088

USPC .................................. 257/334, 368, E27.06
See application file for complete search history.

(56) References Cited

U.S. PATENT DOCUMENTS

| | | | |
|---|---|---|---|
| 4,710,790 | A | 12/1987 | Okamoto et al. |
| 4,881,105 | A | 11/1989 | Davari et al. |
| 5,283,201 | A | 2/1994 | Tsang et al. |
| 5,321,289 | A | 6/1994 | Baba et al. |
| 5,477,071 | A | 12/1995 | Noble |
| 5,502,320 | A | 3/1996 | Yamada |
| 5,614,751 | A | 3/1997 | Yilmaz et al. |

(Continued)

FOREIGN PATENT DOCUMENTS

| | | |
|---|---|---|
| CN | 101385148 | 3/2009 |
| DE | 102005041322 | 3/2007 |

(Continued)

OTHER PUBLICATIONS

Hsu et al., "A Novel Trench Termination Design for 100-V TMBS Diode Application", IEEE Electron Device Letters, vol. 22 No. 11, Nov. 2001, pp. 551-552.

(Continued)

*Primary Examiner* — Matthew C Landau
*Assistant Examiner* — Dmitriy Yemelyanov

(57) ABSTRACT

A semiconductor device includes a first group of trench-like structures and a second group of trench-like structures. Each trench-like structure in the first group includes a gate electrode contacted to gate metal and a source electrode contacted to source metal. Each of the trench-like structures in the second group is disabled. The second group of disabled trench-like structures is interleaved with the first group of trench-like structures.

16 Claims, 4 Drawing Sheets

(56) References Cited

U.S. PATENT DOCUMENTS

| | | | |
|---|---|---|---|
| 5,637,898 A | 6/1997 | Baliga | |
| 5,668,026 A | 9/1997 | Lin et al. | |
| 5,726,463 A | 3/1998 | Brown et al. | |
| 5,763,915 A | 6/1998 | Hshieh et al. | |
| 5,864,159 A | 1/1999 | Takahashi | |
| 5,877,528 A | 3/1999 | So | |
| 5,914,503 A | 6/1999 | Iwamuro et al. | |
| 5,998,833 A | 12/1999 | Baliga | |
| 6,031,265 A | 2/2000 | Hshieh | |
| 6,084,264 A | 7/2000 | Darwish | |
| 6,211,549 B1 | 4/2001 | Funaki et al. | |
| 6,242,775 B1 | 6/2001 | Noble | |
| 6,255,683 B1 | 7/2001 | Radens et al. | |
| 6,281,547 B1 | 8/2001 | So et al. | |
| 6,291,298 B1 | 9/2001 | Williams et al. | |
| 6,309,929 B1 | 10/2001 | Hsu et al. | |
| 6,404,007 B1 | 6/2002 | Mo et al. | |
| 6,413,822 B2 | 7/2002 | Williams et al. | |
| 6,462,376 B1 | 10/2002 | Wahl et al. | |
| 6,465,304 B1 | 10/2002 | Blanchard et al. | |
| 6,465,843 B1 | 10/2002 | Hirler et al. | |
| 6,489,204 B1 | 12/2002 | Tsui | |
| 6,495,884 B2 | 12/2002 | Harada et al. | |
| 6,525,373 B1 | 2/2003 | Kim | |
| 6,545,315 B2 | 4/2003 | Hshieh et al. | |
| 6,548,860 B1 | 4/2003 | Hshieh et al. | |
| 6,621,107 B2 | 9/2003 | Blanchard et al. | |
| 6,683,346 B2 | 1/2004 | Zeng | |
| 6,707,128 B2 | 3/2004 | Moriguchi et al. | |
| 6,781,199 B2 | 8/2004 | Takahashi | |
| 6,838,722 B2 | 1/2005 | Bhalla et al. | |
| 6,882,000 B2 | 4/2005 | Darwish et al. | |
| 6,900,100 B2 | 5/2005 | Williams et al. | |
| 6,906,380 B1* | 6/2005 | Pattanayak et al. | 257/331 |
| 6,921,697 B2 | 7/2005 | Darwish et al. | |
| 7,005,347 B1 | 2/2006 | Bhalla et al. | |
| 7,009,247 B2 | 3/2006 | Darwish | |
| 7,067,870 B2 | 6/2006 | Omura et al. | |
| 7,335,946 B1 | 2/2008 | Bhalla et al. | |
| 7,345,342 B2 | 3/2008 | Challa et al. | |
| 7,385,248 B2 | 6/2008 | Herrick et al. | |
| 7,393,749 B2 | 7/2008 | Yilmaz et al. | |
| 7,456,470 B2 | 11/2008 | Jones | |
| 7,494,876 B1 | 2/2009 | Giles et al. | |
| 7,531,871 B2 | 5/2009 | Omura et al. | |
| 7,544,571 B2 | 6/2009 | Park | |
| 7,598,143 B2 | 10/2009 | Zundel et al. | |
| 7,633,120 B2 | 12/2009 | Hebert | |
| 7,652,329 B2 | 1/2010 | Venkatraman | |
| 7,799,626 B2 | 9/2010 | Pang | |
| 7,859,047 B2 | 12/2010 | Kraft et al. | |
| 7,868,381 B1 | 1/2011 | Bhalla et al. | |
| 7,936,009 B2 | 5/2011 | Pan et al. | |
| 8,008,716 A1 | 8/2011 | Lui et al. | |
| 8,053,834 A1 | 11/2011 | Hebert | |
| 8,048,740 B2 | 11/2011 | Venkatraman | |
| 8,093,654 A1 | 1/2012 | Poelzl et al. | |
| 8,106,487 B2 | 1/2012 | Soendker et al. | |
| 8,120,100 B2 | 2/2012 | Lin et al. | |
| 8,174,070 B2 | 5/2012 | Mallikarjunaswamy | |
| 8,247,865 B2 | 8/2012 | Hirler | |
| 8,378,420 B2 | 2/2013 | Mallikarjunaswamy | |
| 8,431,470 B2 | 4/2013 | Lui et al. | |
| 8,502,302 B2 | 8/2013 | Su et al. | |
| 8,629,505 B2 | 1/2014 | Nishiwaki | |
| 8,686,493 B2 | 4/2014 | Thorup et al. | |
| 8,785,270 B2 | 7/2014 | Su et al. | |
| 8,828,857 B2 | 9/2014 | Lui et al. | |
| 2002/0036319 A1 | 3/2002 | Baliga | |
| 2002/0056884 A1 | 5/2002 | Baliga | |
| 2002/0066924 A1 | 6/2002 | Blanchard | |
| 2002/0070418 A1 | 6/2002 | Kinzer et al. | |
| 2003/0020134 A1 | 1/2003 | Werner et al. | |
| 2003/0042525 A1* | 3/2003 | Tanaka | H01L 29/7813 257/302 |
| 2003/0086296 A1 | 5/2003 | Wu et al. | |
| 2003/0178676 A1 | 9/2003 | Henninger et al. | |
| 2003/0201502 A1 | 10/2003 | Hsieh | |
| 2004/0021173 A1* | 2/2004 | Sapp | H01L 29/7813 257/330 |
| 2004/0038479 A1 | 2/2004 | Hsieh | |
| 2004/0084721 A1 | 5/2004 | Kocon et al. | |
| 2004/0113202 A1 | 6/2004 | Kocon et al. | |
| 2005/0001268 A1 | 1/2005 | Baliga | |
| 2005/0079676 A1 | 4/2005 | Mo et al. | |
| 2005/0082591 A1 | 4/2005 | Hirler et al. | |
| 2005/0151190 A1 | 7/2005 | Kolek et al. | |
| 2005/0167742 A1* | 8/2005 | Challa et al. | 257/328 |
| 2005/0199918 A1 | 9/2005 | Calafut et al. | |
| 2006/0017056 A1* | 1/2006 | Hirler | H01L 29/0878 257/77 |
| 2006/0113577 A1 | 6/2006 | Ohtani | |
| 2006/0209887 A1* | 9/2006 | Bhalla | H01L 29/407 370/466 |
| 2006/0214221 A1 | 9/2006 | Challa et al. | |
| 2006/0273386 A1 | 12/2006 | Yilmaz et al. | |
| 2006/0281249 A1 | 12/2006 | Yilmaz et al. | |
| 2007/0004116 A1 | 1/2007 | Hshieh | |
| 2007/0037327 A1 | 2/2007 | Herrick et al. | |
| 2007/0108511 A1 | 5/2007 | Hirler | |
| 2007/0108515 A1 | 5/2007 | Hueting et al. | |
| 2007/0132014 A1 | 6/2007 | Hueting | |
| 2007/0155104 A1 | 7/2007 | Marchant et al. | |
| 2007/0221952 A1 | 9/2007 | Thorup et al. | |
| 2008/0073707 A1* | 3/2008 | Darwish | H01L 29/407 257/330 |
| 2008/0076222 A1 | 3/2008 | Zundel et al. | |
| 2008/0135889 A1 | 6/2008 | Session | |
| 2008/0166845 A1 | 7/2008 | Darwish | |
| 2008/0197407 A1 | 8/2008 | Challa et al. | |
| 2008/0199997 A1 | 8/2008 | Grebs et al. | |
| 2008/0265289 A1 | 10/2008 | Bhalla et al. | |
| 2009/0035900 A1 | 2/2009 | Thorup et al. | |
| 2009/0050959 A1 | 2/2009 | Madson | |
| 2009/0057756 A1 | 3/2009 | Hshieh | |
| 2009/0072301 A1 | 3/2009 | Bhalla et al. | |
| 2009/0162989 A1 | 6/2009 | Cho et al. | |
| 2009/0218619 A1* | 9/2009 | Hebert | H01L 29/0619 257/332 |
| 2009/0246923 A1 | 10/2009 | Park | |
| 2009/0273026 A1 | 11/2009 | Wilson et al. | |
| 2009/0309156 A1 | 12/2009 | Darwish et al. | |
| 2010/0006928 A1 | 1/2010 | Pan et al. | |
| 2010/0013552 A1* | 1/2010 | Darwish | H01L 29/7839 327/581 |
| 2011/0079843 A1 | 4/2011 | Darwish et al. | |
| 2011/0089485 A1 | 4/2011 | Gao et al. | |
| 2011/0210406 A1* | 9/2011 | Terrill | H01L 29/407 257/412 |
| 2012/0043602 A1* | 2/2012 | Zeng | H01L 29/0623 257/330 |
| 2012/0061753 A1* | 3/2012 | Nishiwaki | H01L 29/407 257/331 |
| 2012/0267704 A1 | 10/2012 | Siemieniec et al. | |
| 2013/0049072 A1 | 2/2013 | Heineck et al. | |
| 2013/0221436 A1 | 8/2013 | Hossain et al. | |

FOREIGN PATENT DOCUMENTS

| | | |
|---|---|---|
| EP | 0717450 A | 6/1996 |
| JP | 63296282 | 2/1988 |
| JP | H03211885 | 1/1990 |
| JP | 03211885 | 9/1991 |
| JP | H07-045817 | 2/1995 |
| JP | H07-235676 | 9/1995 |
| JP | H08-167711 | 6/1996 |
| JP | 10173175 | 6/1998 |
| JP | 11068102 | 3/1999 |
| JP | 2000223705 | 8/2000 |
| JP | 2001308327 | 11/2001 |
| JP | 2002110984 | 4/2002 |
| JP | 2003282870 | 10/2003 |
| JP | 2003309263 | 10/2003 |

(56) References Cited

FOREIGN PATENT DOCUMENTS

| | | |
|---|---|---|
| JP | 2004241413 | 8/2004 |
| JP | 2005032941 | 2/2005 |
| JP | 2005057050 | 3/2005 |
| JP | 2005191221 | 7/2005 |
| JP | 2006202931 | 8/2006 |
| JP | 2007529115 | 10/2007 |
| JP | 2008543046 | 11/2008 |
| JP | 2008546189 | 12/2008 |
| JP | 2008546216 | 12/2008 |
| JP | 2009505403 | 2/2009 |
| JP | 2009141005 | 6/2009 |
| JP | 2009542002 | 11/2009 |
| JP | 2010505270 | 2/2010 |
| JP | 2011258834 | 12/2011 |
| JP | 2012059943 | 3/2012 |
| JP | 2013508980 | 3/2013 |
| WO | 9403922 | 2/1994 |
| WO | 0025363 | 5/2000 |
| WO | 0025365 | 5/2000 |
| WO | 2000042665 | 7/2000 |
| WO | 200051167 A | 8/2000 |
| WO | 200065646 A | 11/2000 |
| WO | 2005065385 | 7/2005 |
| WO | 2006127914 | 11/2006 |
| WO | 2007021701 | 2/2007 |
| WO | 2007129261 | 11/2007 |
| WO | 2009026174 | 2/2009 |
| WO | WO 2011050115 A2 * | 4/2011 |

OTHER PUBLICATIONS

K Imai et al., "Decrease in Trenched Surface Oxide Leakage Currents by Rounding Off Oxidation", Extended Abstracts of the 18.sup.th (1986 International) Conference on Solid State Devices and Materials, Tokyo 1986, pp. 303-306.

Y. Baba et al., "High Reliable UMOSFET with Oxide-Nitride Complex Gate Structure" 1997 IEEE, pp. 369-372.

Initial Publication with ISR, dated Nov. 7, 2013, International application No. PCT/US2013/038956, Korean Intellectual Property Office, Republic of Korea.

Initial Publication with ISR, dated Nov. 7, 2013, International application No. PCT/US2013/038957, Korean Intellectual Property Office, Republic of Korea.

* cited by examiner

SEMICONDUCTOR DEVICE HAVING REDUCED GATE CHARGES AND SUPERIOR FIGURE OF MERIT

RELATED U.S. APPLICATION

This application claims priority to U.S. Provisional Application No. 61/487,627, titled "Semiconductor Device Having Reduced Gate Charges and Superior Figure of Merit," filed on May 18, 2011, which is hereby incorporated by reference in its entirety.

BACKGROUND

In order to realize an energy-efficient power conversion system, power MOSFETs (metal-oxide-semiconductor field-effect transistors) used as core switches rely on low gate charges as well as low on-state resistances. For example, in a DC-to-DC (direct current) converter such as a synchronous buck converter, two MOSFETs are used, one as the "high side" MOSFET and the other as the "low side" MOSFET. The high side MOSFET is controlled by an external enable signal and sources current to a load, while the low side MOSFET connects or disconnects the load to ground and thus sinks current from the load.

There are some specific features and requirements for each of the high side and low side MOSFETs. For example, while lower on-state resistances are desired for the low side MOSFET, high speed switching characteristics having lower gate charges are desired for the high side MOSFET.

One of the widely used metrics for MOSFET performance is a FOM (figure of merit) defined as the gate charge multiplied by the drain-to-source resistance at the specified gate voltages. A lower value for this figure of merit translates to better performance for high side MOSFETs.

A MOSFET that can achieve lower gate charges and hence a lower value for the figure of merit would be both useful and beneficial as, for example, a high side MOSFET in a DC-to-DC converter.

SUMMARY

Embodiments according to the present invention provide efficient and novel metal/insulator/semiconductor (MIS) devices (e.g., MOSFETs) having lower gate charges and lower FOM values.

In one embodiment, a semiconductor device (e.g., a MOSFET) includes a first group of trench-like structures and a second group of trench-like structures (for simplicity, the trench-like structures may be referred to below as trenches). Each of the trenches in the first group includes a gate electrode that is contacted to gate metal, and also includes a source electrode that is contacted to source metal and is insulated from the gate electrode. Each of the trenches in the second group is disabled.

In one embodiment, a layer of the source metal traverses the first group of utilized trenches and the second group of disabled trenches. In such an embodiment, each of the disabled trenches includes a single polysilicon region. The polysilicon regions in each of the disabled trenches are substantially in the same plane as the source and gate electrodes in the utilized trenches. The polysilicon regions in each of the disabled trenches are contacted to the layer of source metal inside the active core region of the semiconductor device and are also contacted to the gate metal. In contrast, in the utilized trenches, the gate electrode is situated between the source electrode and the layer of source metal and is insulated from the layer of source metal but is contacted to the gate metal. Also, in the utilized trenches, the source electrode is contacted to the source metal outside the active core region but is insulated from the layer of source metal inside the active core region.

The second group of disabled trenches is interleaved with the first group of utilized trenches. In one embodiment, the first group of utilized trenches and the second group of disabled trenches are interleaved in alternating fashion. That is, in one embodiment, every other trench is disabled. In other embodiments, every third trench is disabled, or every fourth trench is disabled, and so on.

As an unexpected benefit, if one-half of the trenches are disabled, for example, then the drain-to-source resistance increases by less than a factor of two instead of by a factor of two as expected, while the gate charge decreases by about a factor of two. As a result, the value of the FOM is advantageously reduced by disabling selected trenches as described above.

In one embodiment, the semiconductor device features described above are implemented in a MOSFET. In one such embodiment, those features are implemented in a high side MOSFET coupled to a low side MOSFET in a DC-to-DC converter.

These and other objects and advantages of the present invention will be recognized by one skilled in the art after having read the following detailed description, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention. Like numbers denote like elements throughout the drawings and specification.

DETAILED DESCRIPTION

Figure 1:
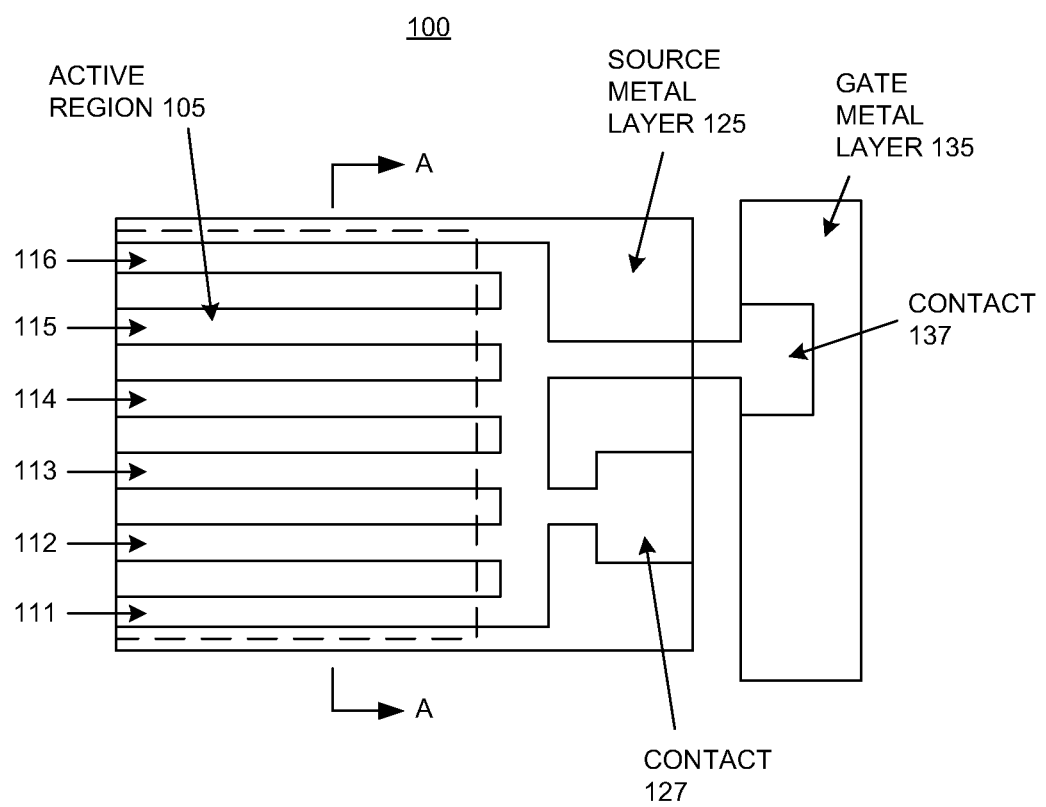
FIG. 1 shows a top-down view of a portion of a semiconductor device in an embodiment according to the present invention.

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating or operating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "producing," "depositing," "etching" or the like, refer to actions and processes of semiconductor device fabrication or operation.

Figures are not drawn to scale, and only portions of the structures, as well as the various layers that form those structures, may be shown in the figures. Furthermore, fabrication processes and steps may be performed along with the processes and steps discussed herein; that is, there may be a number of process steps before, in between and/or after the steps shown and described herein. Importantly, embodiments in accordance with the present invention can be implemented in conjunction with these other (perhaps conventional) structures, processes and steps without significantly perturbing them. Generally speaking, embodiments in accordance with the present invention can replace portions of a conventional device or process without significantly affecting peripheral structures, processes and steps.

The term "trench," when discussed in the context of fabrication of a semiconductor device, generally refers to an empty volume formed within a material. Such a trench may be subsequently filled with another material or materials. The term "trench," when discussed in the context of a fabricated semiconductor device, generally refers to the structure formed within the formerly empty trench. A trench may also be referred to herein as a stripe. The meaning of the term "trench" in the discussion below will be clear within the context of the discussion.

Embodiments according to the present disclosure pertain to new structures to achieve lower gate charges and lower FOM values in semiconductor devices such as MOSFET devices that can be used as high side MOSFETs in, for example, DC-to-DC converters such as synchronous buck converters.

FIG. 1 is a top-down view showing certain elements of a semiconductor device 100 in an embodiment according to the present invention. Not all elements that might be included in a semiconductor device are shown in FIG. 1. Multiple levels are depicted in FIG. 1; that is, for example, the source metal layer 125 is actually over (on top of) the stripes 111-116.

In the example of FIG. 1, the device 100 includes a number of stripes (or cells) 111-116 that are essentially parallel to one another in the active core region 105. The active core region 105 is the region bounded by the dashed lines in FIG. 1.

As will be described further in conjunction with FIG. 2, each of the stripes 111-116 is a trench-like structure. Also, as will be described further in conjunction with FIG. 2, some of the stripes are disabled while others are not. The disabled stripes are electrically and physically connected to the source metal layer 125 inside the active core region 105, and are also electrically and physically connected to the gate metal layer 135 via the gate contact 137. The utilized stripes (those that are not disabled) are insulated from the source metal layer 125 inside the active core region 105, but include a source electrode (see FIG. 2) that is electrically and physically connected to the source metal layer 125 via the source contact 127 outside the active core region, and also include a gate electrode (see FIG. 2) that is electrically and physically connected to the gate metal layer 135 via the gate contact 137.

Figure 2:
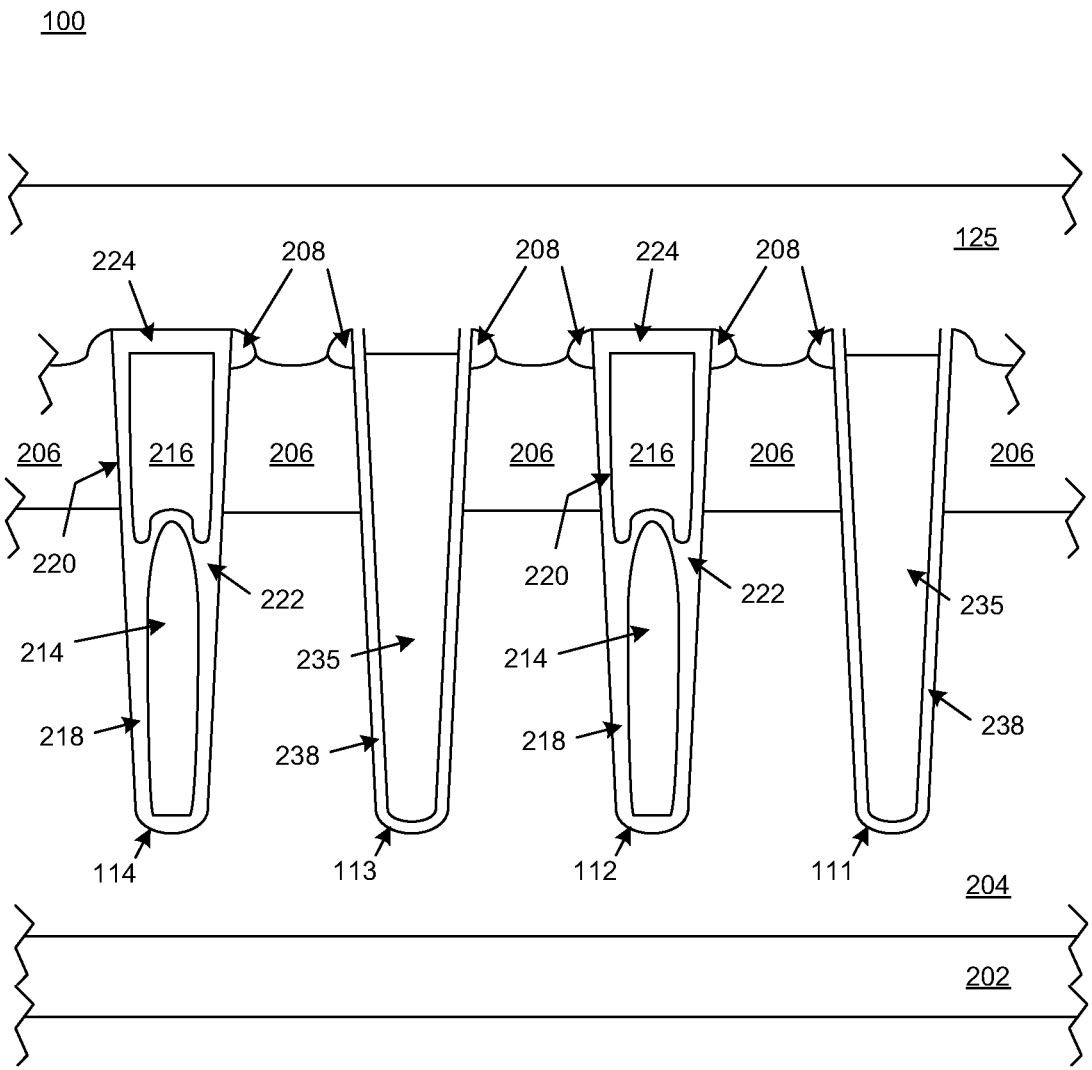
FIG. 2 is a cross-sectional view showing elements of a semiconductor device in embodiments according to the present invention.

FIG. 2 is a cross-sectional view (along the line A-A in FIG. 1) of the device 100 in an embodiment according to the present invention. Not all elements that might be included in a semiconductor device are shown in FIG. 2.

Four trench-like structures 111-114 are shown. For simplicity of discussion, the trench-like structures may be referred to simply as trenches in the discussion below. In the orientation of FIG. 2, as in the orientation of FIG. 1, the trenches 111-114 are parallel to one another.

In the example of FIG. 2, the device 100 includes a first (or buffer) epitaxial layer 202 and a second epitaxial layer 204. There may also be a drain region (not shown) below the first epitaxial layer 202. The trenches 111-114 extend into the second epitaxial layer 204.

A body region 206 (e.g., a p-doped region) is formed between neighboring trenches as shown. Also, source regions 208 (e.g., n+ doped regions) are formed between neighboring trenches as shown. The source metal layer 125 extends across (traverses) the trenches 111-114. As described below, the source metal layer 125 is isolated from the electrodes in selected trenches (e.g., the trenches 112 and 114) in the active region 105 (FIG. 1) of the device 100 but is in contact with the electrodes in other selected trenches (e.g., the trenches 111 and 113) in the active core region. Accordingly, in the example of FIG. 2, the trenches 111 and 113 are disabled while the trenches 112 and 114 are utilized (not disabled).

The trenches 112 and 114 may be referred to as split gates. Each of the trenches 112 and 114 includes a first polysilicon (poly-1) region 214, also referred to as a source electrode or a shield electrode. Each of the trenches 112 and 114 also includes a second polysilicon (poly-2) region 216, also referred to as a gate electrode. The source electrodes 214 are separated from the adjacent epitaxial layer 204 by a shield oxide 218, and the gate electrodes 216 are separated from the adjacent epitaxial layer 204 by a gate oxide 220. The source electrodes 214 in the trenches 112 and 114 are insulated from the gate electrodes 216 in the trenches 112 and 114 by an intervening oxide layer 222. In the trenches 112 and 114, the gate electrodes 216 are situated between the source electrodes 214 and the source metal layer 125. The gate electrodes 216 are insulated from the source metal layer 125 by an intervening isolation oxide layer 224. With reference also to FIG. 1, the source electrodes 214 in the trenches 112 and 114 are electrically and physically contacted to the source metal layer 125 via the source contact 127, and the gate electrodes 216 inside the trenches 112 and 114 are electrically and physically contacted to the gate metal layer 135 via the gate contact 137 (FIG. 1).

In the embodiment of FIG. 2, each of the disabled trenches 111 and 113 includes a single polysilicon (poly-1) region 235 contacted to the source metal layer 125 and to the gate metal layer 135 (FIG. 1). The poly-1 regions 235 of the disabled trenches 111 and 113 are substantially in the same plane as the source electrodes 214 and the gate electrodes 216 in the utilized trenches. That is, in the orientation of FIG. 2, the tops of the poly-1 regions 235 roughly coincide with the tops of the gate electrodes 216, and the bottoms of the poly-1 regions 235 roughly coincide with the bottoms of the source electrodes 214. The poly-1 regions 235 are separated from the adjacent epitaxial layer 204 by an oxide layer 238.

Significantly, the poly-1 regions 235 are not insulated from the source metal layer 125; the source metal layer 125 is electrically and physically in contact with the poly-1 regions 235. Furthermore, with reference also to FIG. 1, the poly-1 regions 235 in the trenches 111 and 113 are also electrically and physically contacted to the source metal layer 125 via the source contact 127 and to the gate metal layer 135 via the gate contact 137.

Figure 3:
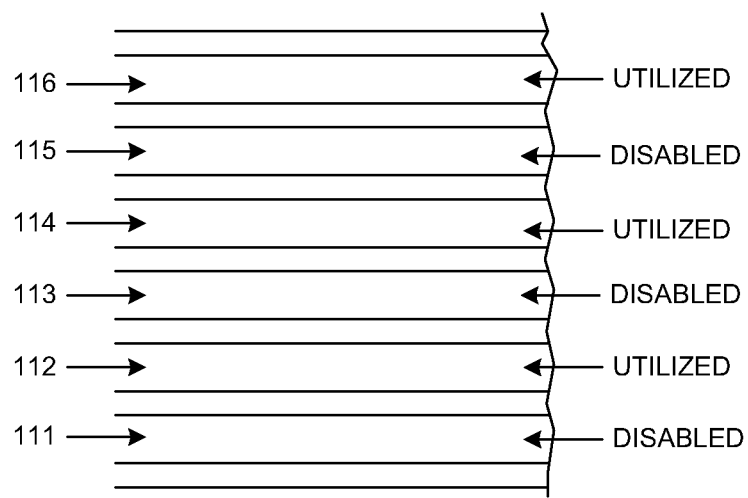
FIG. 3 shows a top-down view of a portion of a semiconductor device in an embodiment according to the present invention.

Thus, in the example of FIG. 2, half of the cells/stripes/trenches are utilized (e.g., the trenches 112 and 114) and half of the cells/stripes/trenches are disabled (e.g., the trenches 111 and 113). In other words, the utilized cells/stripes/trenches are interleaved with the disabled cells/stripes/trenches in alternating fashion, such that every other cell/stripe/trench is disabled. This is shown in FIG. 3, which represents a top-down view of the device 100. In other embodiments, the core cells/stripes can be disabled by one-third (every third cell/stripe/trench disabled), one-fourth, one-fifth, and so on.

As mentioned above, a widely used metric for MOSFET performance is a FOM defined as the gate charge multiplied by the drain-to-source resistance at the specified gate voltages. A lower value for this FOM translates to better performance for high side MOSFETs.

Utilizing a core area as large as before, it might be expected that, if half of the core cells/stripes/trenches are utilized and the other half of the core cells/stripes/trenches are disabled, then the gate charges would decrease by half and the resistances would increase by a factor of two. However, because there is current crowding in the drift region for high density cell devices such as those described herein, some series resistances from that region are experienced. By disabling some (e.g., half) of the core cells/stripes/trenches, the carriers flowing through one side channel of the core cell/stripe use the whole drift region, and so less current crowding for the flow of carriers and less series resistance from that region are experienced. Consequently, in actuality, the overall drain-to-source resistances increase less than a factor of two if half of the core cells/stripes/trenches are disabled.

On the other hand, the gate charges decrease proportionally according to the active core cell area. As a result of the combined effects on the drain-to-source resistance and the gate charge, a better FOM can be achieved using the approach described in the present disclosure.

This is illustrated by the results included in Table 1. "Rsp4.5V(Core)" stands for the specific resistance between the drain and the source at a gate voltage of 4.5V of a single core cell/stripe. "Rds(on) @4.5V typical" demonstrates final product resistance between the drain and the source at a gate voltage of 4.5V in a Power PAK® 1212 package. "Qgsp4.5V" stands for the specific gate charges per unit active area at a gate voltage of 4.5V. "Qg4.5V" shows a value of the total gate charges at a gate voltage of 4.5V. The FOM is the product of Qg4.5V and Rds(on) @4.5V typical. Embodiments according to the present disclosure improve FOM values by about 32 percent if half of the core cells/stripes/trenches are disabled.

TABLE 1

Example Results

| | Units | Conventional Art | Embodiment of Present Disclosure | Percent Change |
|---|---|---|---|---|
| Rsp 4.5 V (core) | mΩ · mm² | 4.43 | 6.22 | 40% |
| Rds(on) @ 4.5 V (typical) | mΩ | 2.2 | 2.8 | 28% |

TABLE 1-continued

Example Results

| | Units | Conventional Art | Embodiment of Present Disclosure | Percent Change |
|---|---|---|---|---|
| Qgsp 4.5 V | nC/mm² | 8.3 | 4.4 | −47% |
| Qg 4.5 V | nC | 24.1 | 12.8 | −47% |
| FOM | Qg 4.5 * Rds 4.5 | 53 | 36 | −32% |

Figure 4:
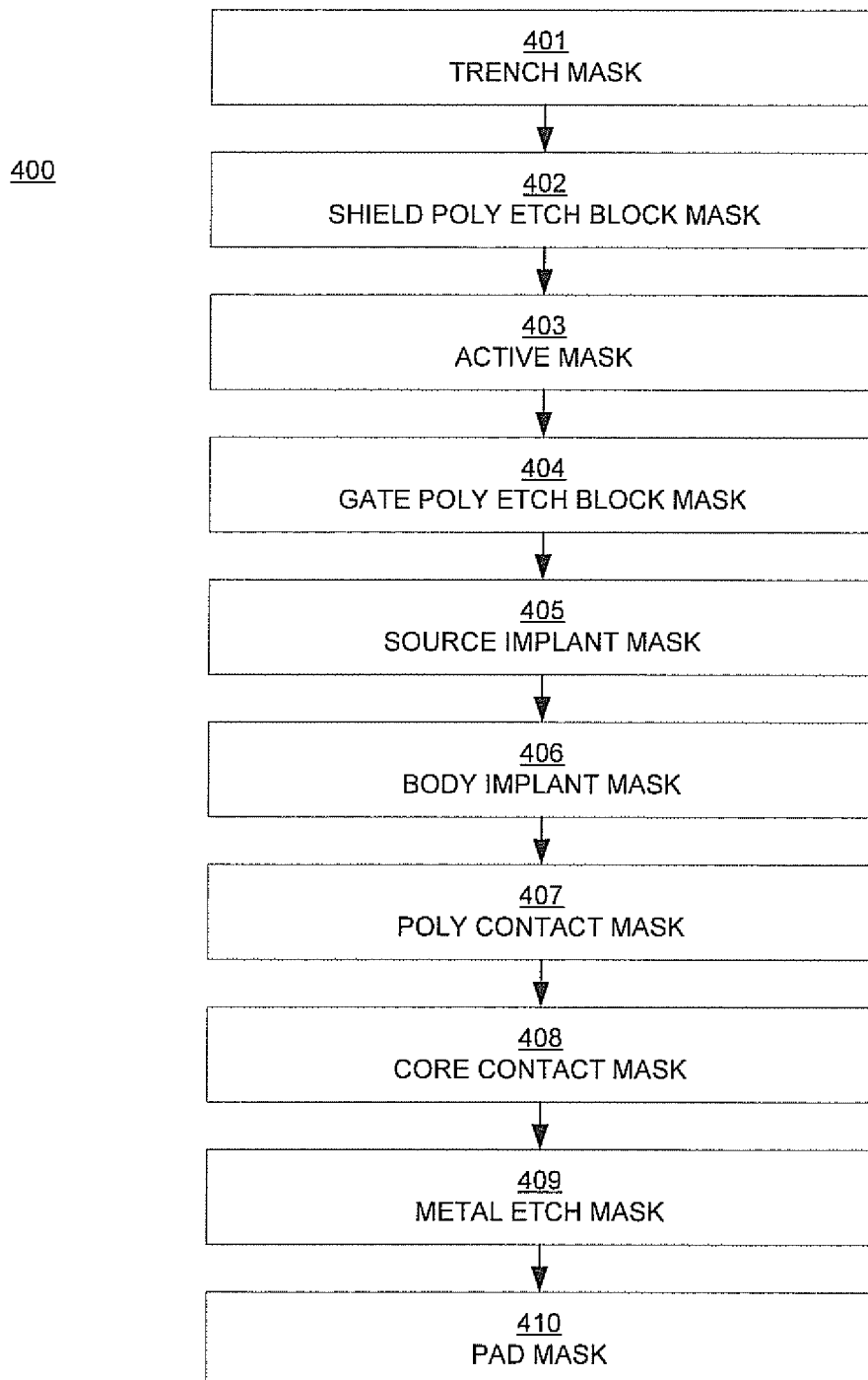
FIG. 4 is a flowchart listing masks used in a process for fabricating semiconductor devices in an embodiment according to the present invention.

FIG. 4 is a flowchart 400 showing the sequence of masks that are used to form the disabled stripes/trenches and the utilized stripes/trenches in an embodiment according to the present invention. Other masks and fabrication process steps may be utilized with the masks included in the following discussion. The discussion below is intended to highlight changes in the fabrication process that are introduced to form the disabled trenches referred to above. FIG. 4 is discussed with reference also to FIG. 2.

In block 401, a trench mask is utilized to form empty trenches 111-114. In block 402, after poly-1 is deposited in the trenches, a shield (source) poly etch block mask is configured such that the poly-1 in the disabled trenches 111 and 113 is not exposed to an etch while the poly-1 in the utilized trenches 112 and 114 is exposed to the etch. Thus, the poly-1 in the disabled trenches 111 and 113 is not etched back, but the poly-1 in the utilized trenches 112 and 114 is etched back to form the source electrodes 214.

In block 403, an active mask is utilized to prevent the thick oxide layer 238 lining the disabled trenches 111 and 113 from being thinned and to prevent poly-2 from being deposited into the disabled trenches. The trenches 112 and 114 are not protected by the active mask, so that the gate oxide 220 is thinned prior to poly-2 deposition in the trenches 112 and 114 to form the gate electrodes 216.

In block 404, a gate poly etch block mask is used during etch back of the poly-2 regions. In block 405, a source implant mask is utilized for proper deposition of the source regions 208. In block 406, a body implant mask is utilized for proper deposition of the body regions 206. In blocks 407, 408, 409, and 410, poly contact, core contact, metal etch, and pad masks are respectively utilized to form the contacts 135 and 137 and to contact the electrodes 214, 216, and 235 with the source metal and gate metal.

Thus, in order to form the disabled trenches 111 and 113, a shield poly etch block mask (block 402) and an active mask (block 403) are introduced or modified. Accordingly, the disabled trenches can be formed without significantly perturbing the fabrication process.

In summary, embodiments of semiconductor devices, and embodiments of methods for fabricating such devices, are described. Embodiments according to the invention can be used in high density trench power MOS transistors and in the charge balance MOSFET family with a split gate structure. Embodiments according to the invention can be applied in high side DC-DC converter applications.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A semiconductor device comprising:
   a planar first epitaxial layer; and
   a plurality of trench-like structures that extend into a second epitaxial layer coupled to the first epitaxial layer, said plurality of trench-like structures comprising:
      a first plurality of said plurality of trench-like structures, said first plurality comprising first trench-like structures, each trench-like structure in said first plurality comprising a gate electrode contacted to gate metal and insulated from source metal by an intervening oxide layer, each trench-like structure in said first plurality further comprising a source electrode of polysilicon material contacted to said source metal, wherein said gate electrode is separated from said second epitaxial layer by a gate oxide, and wherein said source electrode is separated from said second epitaxial layer by a shield oxide; and
      a second plurality of said plurality of trench-like structures, said second plurality comprising second trench-like structures, said second trench-like structures interleaved with said first trench-like structures in alternating fashion such that every other of said plurality of trench-like structures is one of said second trench-like structures, wherein each of said second trench-like structures is adjacent to both a respective first source region and a respective second source region, wherein each trench-like structure of said second trench-like structures is filled with said polysilicon material to form only one polysilicon region within said each trench-like structure of said second trench-like structures, wherein each said only one polysilicon region is electrically and physically contacted to said source metal via a source contact and is separated from said second epitaxial layer by said shield oxide, wherein each said only one polysilicon region is also electrically and physically contacted to said gate metal via a gate contact, and wherein a bottom surface of said only one polysilicon region and a bottom surface of said source electrode are aligned with each other substantially in a same plane that is parallel to said planar first epitaxial layer.

2. The semiconductor device of claim 1 wherein each said polysilicon region is contacted to said source metal at a respective top surface of each said only one polysilicon region, and wherein each said top surface coincides with a top surface of said gate electrode.

3. The semiconductor device of claim 1 comprising a layer of said source metal that traverses said first plurality of said plurality of trench-like structures and said second plurality of said plurality of trench-like structures, wherein said source electrode is contacted to said source metal outside an active core region of said semiconductor device and wherein said source electrode is insulated from said layer of said source metal inside said active core region, and wherein said second trench-like structures are contacted to said layer of said source metal inside said active core region.

4. The semiconductor device of claim 1 wherein said source metal traverses said first plurality of said plurality of trench-like structures and said second plurality of said plurality of trench-like structures, wherein said gate electrode is situated between said source electrode and said source metal.

5. The semiconductor device of claim 1 comprising a high side metal-oxide-semiconductor field-effect transistor (MOSFET) in a direct current (DC)-to-DC converter.

6. The semiconductor device of claim 1 wherein each said only one polysilicon region within said each trench-like structure of said second trench-like structures is also contacted to said gate metal.

7. The semiconductor device of claim 1 wherein each trench-like structure in said plurality of trench-like structures is adjacent to both a respective first source region and a respective second source region.

8. The semiconductor device of claim 1 wherein said first plurality of said plurality of trench-like structures and said second plurality of said plurality of trench-like structures extend to a same depth in said second epitaxial layer.

9. The semiconductor device of claim 1 wherein said plurality of trench-like structures are in an active core region of said semiconductor device, wherein one-half of said plurality of trench-like structures in said active core region comprise said first plurality of said plurality of trench-like structures and wherein one-half of said plurality of trench-like structures in said active core region comprise said second plurality of said plurality of trench-like structures.

10. The semiconductor device of claim 1 wherein a top surface of said only one polysilicon region and a top surface of said gate electrode are aligned with each other in a same plane that is parallel to said planar first epitaxial layer.

11. A semiconductor device comprising:
    a planar first epitaxial layer; and
    a plurality of trench-like structures that extend into a second epitaxial layer, said plurality of trench-like structures comprising:
       a first plurality of split-gate first structures, each of said split-gate first structures comprising a first electrode region of polysilicon material and also comprising a second electrode region of said polysilicon material, said first plurality of said plurality of trench-like structures including a split-gate first trench-like structure, wherein said second electrode is separated from said second epitaxial layer by a gate oxide, and wherein said first electrode is separated from said second epitaxial layer by a shield oxide; and
       a second plurality of second structures, each second structure of said second structures comprising only one polysilicon region of said polysilicon material that fills said each second structure, wherein each said only one polysilicon region is electrically and physically in contact with source metal via a source contact and is separated from said second epitaxial layer by said shield oxide, wherein each said only one polysilicon region is also electrically and physically contacted to gate metal via a gate contact, and wherein a bottom surface of said only one polysilicon region and a bottom surface of said first electrode region are aligned with each other substantially in a same plane that is parallel to said planar first epitaxial layer, said first plurality of split-gate first structures comprising half of said plurality of trench-like structures and said second plurality of second structures comprising the remainder of said plurality of trench-like structures, said second plurality of second structures interleaved with said first plurality of split-gate first structures in alternating fashion such that every other of said trench-like structures in said plurality of trench-like structures is one of said second trench-like structures, said second plurality of second structures including a second trench-like structure, wherein a first source region and a second source region are between said split-gate first trench-like structure and said second trench-like structure, said first source region adjacent to said split-gate first trench-like structure and said second source region adjacent to said second-like structure trench; and a layer comprising said source metal that is insulated from said first split gate structures within an active region of said semiconductor device and is in contact with each polysilicon region of said plurality of disabled second structures within said active region.

12. The semiconductor device of claim 11 wherein each said first electrode region comprises a source electrode contacted to said source metal outside said active region, and wherein each said second electrode comprises a gate electrode contacted to said gate metal outside said active region.

13. The semiconductor device of claim 12 wherein each said gate electrode is situated between a respective source electrode and said layer comprising said source metal, and wherein said gate electrode is insulated from said layer comprising said source metal and also from said respective source electrode.

14. The semiconductor device of claim 11 wherein each said polysilicon region is contacted to said source metal at a respective top surface of each said only one polysilicon region, and wherein each said top surface is coplanar with a top surface of each said first electrode region.

15. The semiconductor device of claim 12 wherein each said only one polysilicon region that fills said each disabled second structure is also in contact with said gate metal.

16. The semiconductor device of claim 11 wherein a top surface of said only one polysilicon region and a top surface of said second electrode region are aligned with each other in a same plane that is parallel to said planar first epitaxial layer.

* * * * *